US012166122B2

United States Patent
Shivaraman et al.

(10) Patent No.: US 12,166,122 B2
(45) Date of Patent: Dec. 10, 2024

(54) FIELD-EFFECT TRANSISTOR (FET) WITH SELF-ALIGNED FERROELECTRIC CAPACITOR AND METHODS OF FABRICATION

(71) Applicant: Intel Corporation, Santa Clara, CA (US)

(72) Inventors: Shriram Shivaraman, Hillsboro, OR (US); Uygar Avci, Portland, OR (US); Ashish Verma Penumatcha, Beaverton, OR (US); Nazila Haratipour, Portland, OR (US); Seung Hoon Sung, Portland, OR (US); Sou-Chi Chang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 839 days.

(21) Appl. No.: 17/133,197

(22) Filed: Dec. 23, 2020

(65) Prior Publication Data

US 2022/0199833 A1 Jun. 23, 2022

(51) Int. Cl.
*H01L 29/78* (2006.01)
*H01L 21/28* (2006.01)
*H01L 29/51* (2006.01)
*H01L 29/66* (2006.01)
*H10B 51/30* (2023.01)

(52) U.S. Cl.
CPC .. *H01L 29/78391* (2014.09); *H01L 29/40111* (2019.08); *H01L 29/516* (2013.01);
(Continued)

(58) Field of Classification Search
CPC ......... H01L 29/66795; H01L 29/78391; H01L 29/40111; H01L 29/516; H01L 29/6654;
(Continued)

(56) References Cited

U.S. PATENT DOCUMENTS 10,916,655 B2 * 2/2021 Song ..................... H01L 29/517
11,018,256 B2 * 5/2021 Lin ................... H01L 29/66795
(Continued)

FOREIGN PATENT DOCUMENTS

WO 2015164141 10/2015

OTHER PUBLICATIONS

Extended European Search Report from European Patent Application No. 21209149.0 notified Apr. 20, 2022, 9 pgs.
(Continued)

*Primary Examiner* — Khiem D Nguyen
(74) *Attorney, Agent, or Firm* — Essential Patents Group, LLP

(57) ABSTRACT

A memory device structure includes a transistor structure including a gate electrode over a top surface of a fin and adjacent to a sidewall of the fin, a source structure coupled to a first region of the fin and a drain structure coupled to a second region of the fin, where the gate electrode is between the first and the second region. A gate dielectric layer is between the fin and the gate electrode. The memory device structure further includes a capacitor coupled with the transistor structure, the capacitor includes the gate electrode, a ferroelectric layer on a substantially planar uppermost surface of the gate electrode and a word line on the ferroelectric layer.

13 Claims, 8 Drawing Sheets

(52) U.S. Cl.
CPC .. *H01L 29/66545* (2013.01); *H01L 29/66795* (2013.01); *H01L 29/6684* (2013.01); *H01L 29/7851* (2013.01); *H10B 51/30* (2023.02)

(58) Field of Classification Search
CPC ........ H10B 53/30; H10B 51/30; H10B 12/36; H10B 12/033; H10B 12/056
See application file for complete search history.

(56) References Cited

U.S. PATENT DOCUMENTS 11,482,529 B2 * 10/2022 Manipatruni .......... H10B 12/36
2009/0224301 A1 * 9/2009 Yamakawa ............ H10B 53/00 257/295
2015/0311349 A1 * 10/2015 Ramaswamy ...... H01L 29/6684 257/295
2019/0165146 A1 * 5/2019 Ho .................... H01L 23/53209
2019/0237464 A1 * 8/2019 Ching .................. H01L 29/785

OTHER PUBLICATIONS

Hueting, Raymond J., "The Balancing Act in Ferroelectric Transistors: How Hard Can It Be?", Micromachines Sep. 2018, 582, 14 pgs.
Ni, Kai et al., "Critical Role of Interlayer in Hf0.5Zr0.5O2 Ferroelectric FET Nonvolatile Memory Performance", IEEE Transactions on Electron Devices, vol. 65, No. 6, Jun. 2018, 9 pgs.

* cited by examiner

FIELD-EFFECT TRANSISTOR (FET) WITH SELF-ALIGNED FERROELECTRIC CAPACITOR AND METHODS OF FABRICATION

BACKGROUND

Ferroelectric materials have a wide variety of applications in the modern electronic industry. These materials have been widely studied for non-volatile memory, neuromorphic applications. Non-volatility, fast switching speed, scalability and reliability make these materials interesting for memory applications. In some applications ferroelectric capacitors can be integrated with non-planar transistors such as fin-field effect transistor (fin-FET) to create a memory device. However, viable memory operation necessitates balancing capacitance between the ferroelectric capacitor and fin-FET device. As such, more work is needed in this area.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

DESCRIPTION OF THE EMBODIMENTS

Figure 1:
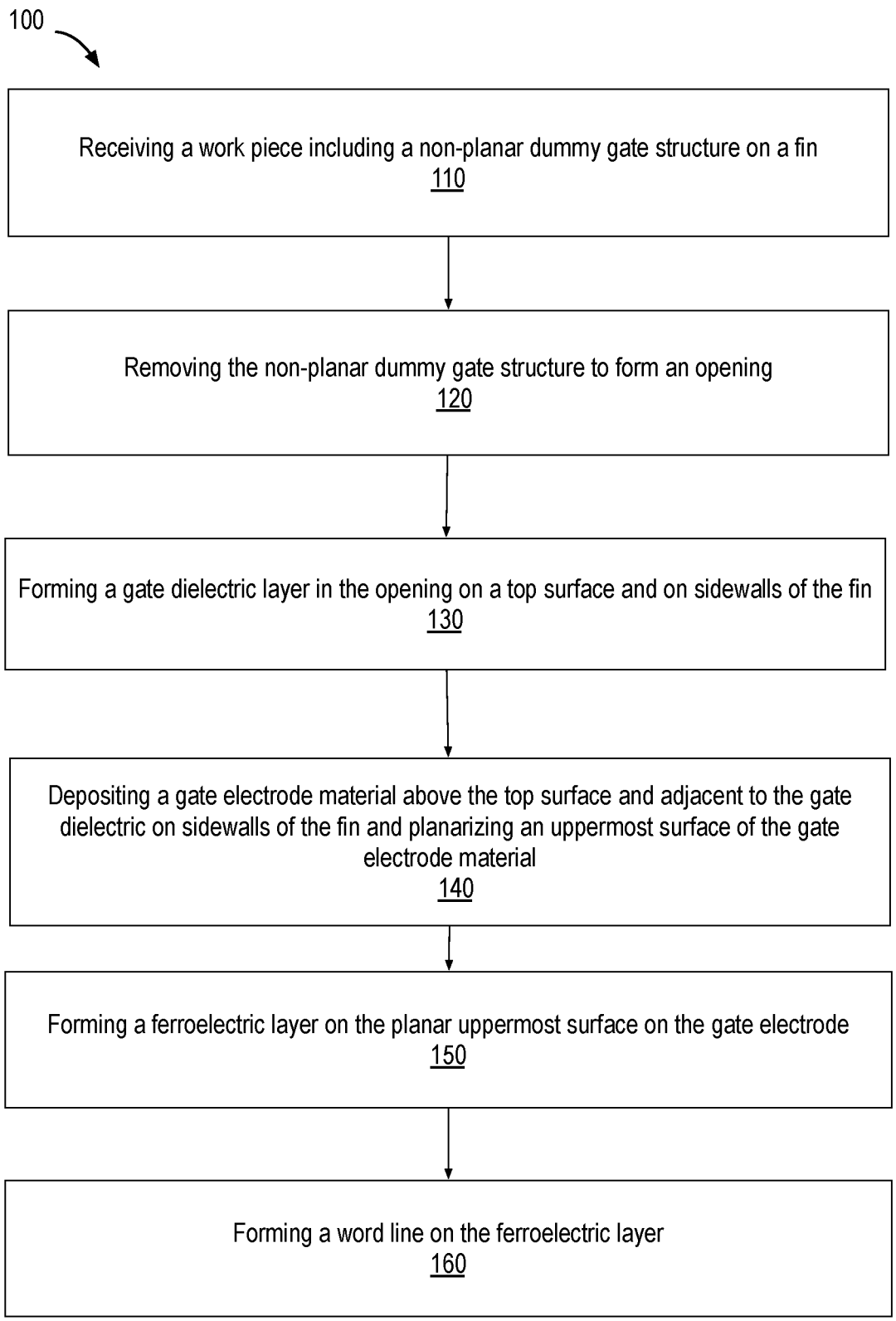
FIG. 1 is a method to fabricate a capacitor device integrated with a gate structure, in accordance with an embodiment of the present disclosure.

Field-Effect Transistor (FET) with Self-Aligned Ferroelectric Capacitor and methods of fabrication are described. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as operations associated with fin-FET transistors, are described in lesser detail in order to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, electrical or in magnetic contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

As used throughout this description, and in the claims, a list of items joined by the term "at least one of" or "one or more of" can mean any combination of the listed terms.

Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Ferroelectric materials may bridge the gap for capacitor-based memory devices, where the ferroelectric materials can be used as a replacement for conventional high-K dielectric materials. Not only do ferroelectric materials have a higher dielectric constant (at least 2-3 times greater) compared to high-K materials such as oxides of Hf, Zr etc, but ferroelectric materials are often split into domains having different directions of spontaneous polarization. Spontaneous polarization results from atomic separation between the constituent atoms in a ferroelectric material that create electric dipoles within the ferroelectric material. A single domain includes a large collection of dipoles having a single orientation.

Dipoles in a ferroelectric material can have their orientation altered by an externally applied electric field. When a ferroelectric material is sandwiched between two electrodes, for example as in a capacitor, applying a potential difference between the two electrodes can generate an electric field. If the electric field is sufficiently large, the direction of the spontaneous polarization can be set by the applied electric field. The applied electric field can manipulate the direction of the polarization in the ferroelectric material. The direction of the polarization may be set in the ferroelectric material at a beginning of operation and reset by application of a voltage bias that is greater than a coercive voltage (a minimum voltage required to change the direction of polarization).

One example of a ferroelectric memory device is a one-transistor one-capacitor (1T1C) memory cell, where the capacitor is a ferroelectric capacitor. However, integrating a parallel plate ferroelectric capacitor on a transistor drain occupies significant chip real-estate. The problem is compounded when transistor dimensions, such as gate length and spacing between adjacent gates are scaled to less than 10 nm and 40 nm, respectively, for example Fabrication of capacitor devices including vias or plates coupled with a drain terminal can be very challenging. Integrating a ferroelectric capacitor with a gate electrode of the transistor, as opposed to the drain, can be advantageous.

In one embodiment, the ferroelectric layer is formed directly on a gate electrode of a transistor, and a word line is formed on the ferroelectric layer to form a ferroelectric capacitor. The gate electrode, for example may be a planar gate. An overlap between the word line and the planar gate electrode defines a size of the ferroelectric capacitor. In one such configuration, the gate electrode is a floating gate and is shared by both the ferroelectric capacitor and the transistor structure. The ferroelectric capacitor formed may be of the size of the gate electrode. However, when forming a ferroelectric capacitor on a gate electrode of a transistor, it is important to balance the capacitance of the ferroelectric capacitor with a capacitance resulting from the gate dielectric layer sandwiched between a channel and the gate electrode of the transistor. It is desirable that the gate capacitance be significantly greater than a capacitance of the ferroelectric capacitor for an optimal memory window operation. A greater gate capacitance is also desirable because, it translates to a lower total operating voltage. A lower transistor operating voltage is desirable and advantageous because it results in a lower electric field in the gate dielectric and may prevent dielectric breakdown. An increase in gate capacitance may also increase drive current of a transistor. However, increasing the gate capacitance can be challenging. Capacitance of a parallel plate structure (for either the planar gate or the ferroelectric capacitor) is given by equation [1]:

$$C = A_P \varepsilon_1 / t_d \quad [1],$$

where, $A_P$=area of parallel plates (for planar gate and for planar capacitor)

$\varepsilon_1$=permittivity of dielectric material (gate or capacitor), and $t_d$=thickness of the dielectric material (gate dielectric or insulator between parallel plates)

Capacitance can be increased by reducing $t_d$, however, this can lead to a greater leakage and dielectric breakdown. A high dielectric constant material can be utilized to prevent dielectric breakdown. Another way to increase capacitance is to increase $A_P$. In a parallel plate ferroelectric capacitor one way to reduce the capacitance is to increase thickness of ferroelectric layer. However, this can increase the operating voltage and also present practical problems such as etching difficult to pattern dielectric materials.

To increase capacitance of the gate structure relative to the capacitance of a parallel plate capacitor, the inventors propose using a non-planar fin-FET geometry to fabricate a ferroelectric capacitor based ferroelectric memory cell. Forming a gate electrode around a fin structure of a fin-FET transistor can increase a gate capacitor area compared to a planar gate structure, for example.

Equation [1] also approximately provides the total capacitance in a fin-FET geometry. The gate capacitor area can be varied by increasing the fin height, the fin width or a combination thereof. Increasing the fin height provides a desirable way to increase gate capacitance over increasing the fin width. Increasing fin height for a given fin width provides a way to further increase drive current while maintaining electrostatic control of gate. In some embodiments, the number of fins may be increased, while the spacing between each fin is kept to a minimum. Such as for example, spacing is enough to form a gate structure adjacent to each fin sidewall.

Furthermore, to preserve an area of the ferroelectric capacitor, an uppermost surface of the gate electrode may be planarized. A ferroelectric layer can be formed on the planarized gate electrode and a word line can be formed on the ferroelectric layer to form a planar ferroelectric capacitor. The area of the ferroelectric capacitor depends on a planarized uppermost surface area of the gate electrode, while the area of the gate capacitor depends on an overlap between the non-planar gate and the fin. The area of the gate capacitor can be changed by adjusting the fin height.

In embodiments, the ferroelectric layer can extend from a first gate electrode of a first transistor to a second gate electrode of an adjacent second transistor, where the first and second gate electrodes are laterally separated by a dielectric. The word line may also extend above the ferroelectric layer, and continuously above the first and the second gate. In such example, a first and a second ferroelectric capacitor may be formed (by appropriate biasing source and drain terminals of respective first and second transistors. The word line and the ferroelectric layer may be self-aligned with each of the first and second gate electrodes.

Polarization in one or more domains in a ferroelectric material can respond to locally applied external fields (or voltage between word line and gate electrode). In some examples, where distinct word lines are formed above each of the first and the second gate electrode, polarization can be set (or programmed) independently in the first or the second ferroelectric capacitor.

FIG. 1 is a method 100 to fabricate a ferroelectric capacitor device integrated with a non-planar capacitor structure, in accordance with an embodiment of the present disclosure. The method 100 begins at operation 110 by receiving a workpiece including a plurality of non-planar dummy gate structures separated by a dielectric barrier. The method 100 continues at operation 120 with the process to remove dummy gate structures to form a plurality of openings to expose a plurality of fin structures. The method continues at operation 130 with the formation of a gate dielectric layer in each of the plurality of openings on each of the plurality of fin structures. The method continues at operation 140 with the formation of a plurality of gate electrodes, each having a planar uppermost surface, on the gate dielectric layer. The method continues at operation 150 with the formation of a ferroelectric layer on the planar uppermost surfaces of each of the plurality of gate electrodes and on an uppermost surface of the dielectric barrier. The method concludes at operation 160 with the formation of a word line on the ferroelectric layer.

Figure 2A:
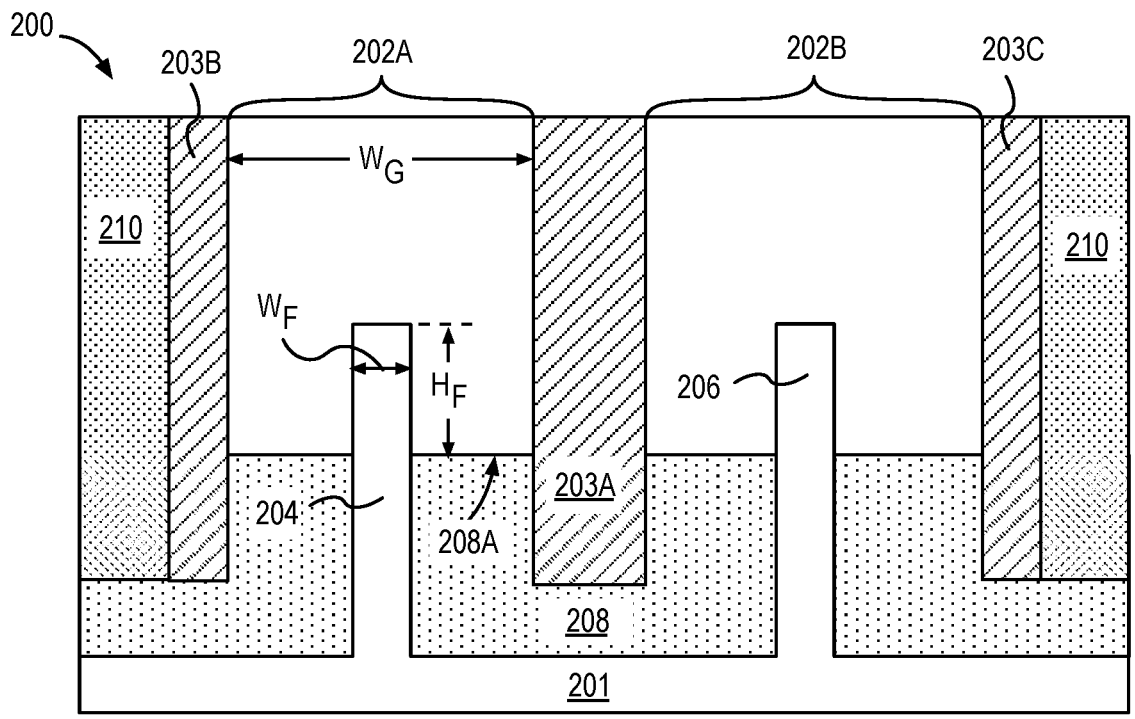
FIG. 2A is a cross-sectional illustration of a work piece including a plurality of non-planar dummy gate structures formed above a substrate.

FIG. 2A is a cross-sectional illustration of a work piece 200 including a plurality of non-planar dummy gate structures. As shown, dummy gate structures 202A and 202B are formed above a substrate 201 and are separated by a dielectric 203.

In embodiments, each of the dummy gate structures 202A and 202B include a sacrificial material that is designed to be removed and replaced with one or more materials of a gate structure to be formed. The dummy gate structures 202A and 202B include a sacrificial material that is designed to be removed selectively with respect to other structures within workpiece 200. In exemplary embodiments, dummy gate structures 202A and 202B include amorphous polysilicon or polysilicon.

In the illustrative embodiment, the dummy gate structure 202A is formed above a fin 204 and dummy gate structure 202B is formed above a fin 206. A dielectric 208 is adjacent to a portion of each fin 204 and 206. A vertical distance between the uppermost surface of dielectric 208A and an uppermost surface of each fin 204 and 206 is defined as a fin height, $H_F$. In embodiments, $H_F$ is at least 25 nm. In other embodiments, $H_F$ is at least 25 nm but less than 60 nm. In the illustrative embodiment, the fins 204 and 206 each have a lateral thickness, $W_F$ (along the X direction). In embodiments, $W_F$ is at least 5 nm. In some embodiments $W_F$ is at least 5 nm but less than 10 nm. $H_F$ and $W_F$ partially influence a total capacitance of a device that will be formed around each fin 204 and 206.

As shown, dielectric 203 includes a portion 203A between dummy gate structures 202A and 202B, a portion 203B adjacent to dummy gate structure 202A and a portion 203C adjacent to dummy gate structure 202B. The workpiece 200 further includes a dielectric 210 on dielectric 208 and adjacent to dielectric portions 203B and 203C.

In some embodiments, the fins 204 and 206 include monocrystalline silicon, silicon germanium or germanium. In some embodiments, fins 204 and 206 can include thin film semiconductor materials such as polysilicon or semiconducting oxides. In the illustrative embodiment, the fins 204 and 206 extend from the substrate and include a material of the substrate 201. In some such embodiments, the substrate 201 includes silicon, silicon germanium or germanium. In other embodiments substrate 201 includes a layer of silicon oxide on a layer of monocrystalline silicon and the fins 204 and 206 each include monocrystalline silicon.

In an exemplary embodiment, dielectric 203 includes silicon and one or more of oxygen, nitrogen or carbon. In embodiments, the dielectric 208 includes silicon and one or more of nitrogen, oxygen or carbon. The dielectric 208 may be compositionally different from the dielectric 203, for example, dielectric 203 may have a greater density than a density of the dielectric 208. In an embodiment, dielectric 203 includes silicon and at least one of oxygen, nitrogen and carbon having a flowable composition. In embodiments, dielectric 210 includes a different material than a material of dielectric 203 or 208.

Figure 2B:
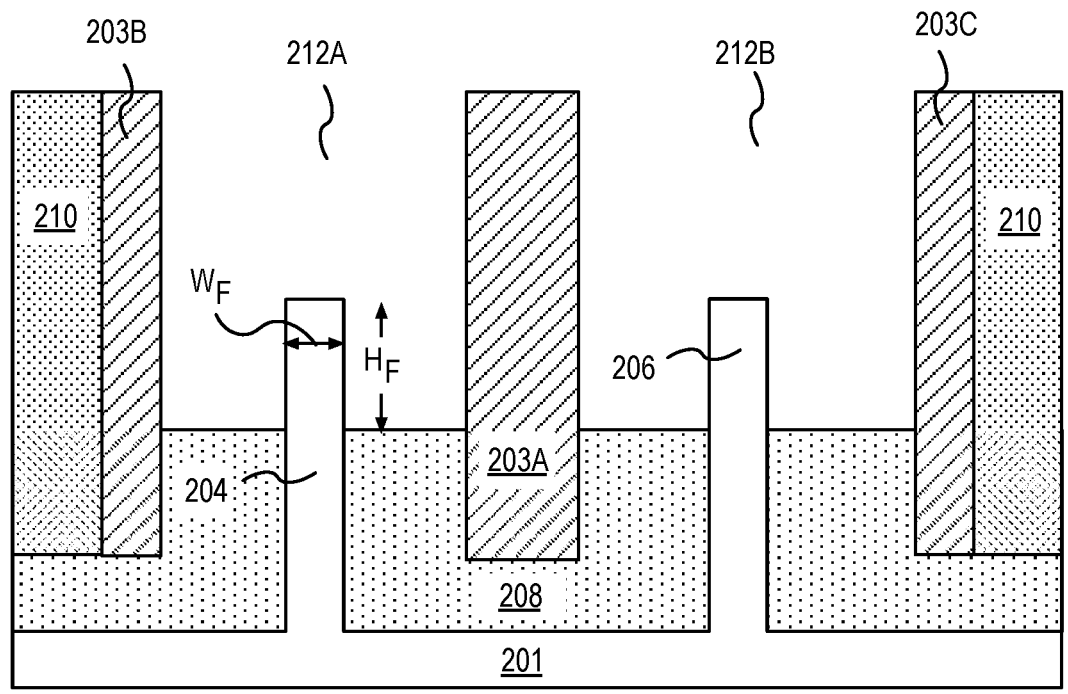
FIG. 2B is a cross-sectional illustration of the structure in FIG. 2A following the removal of the plurality of non-planar dummy gate structures.

FIG. 2B is a cross-sectional illustration of the structure in FIG. 2A following the removal of the plurality of non-planar dummy gate structures to form openings 212A and 212B. In an embodiment, the polysilicon or amorphous poly silicon is removed selective to the dielectric 203, 208 and 210. Furthermore, it is to be appreciated that when fins 204 and 206 include silicon, the silicon fins 204 and 206 are each cladded by a silicon dioxide layer (not shown) to protect the silicon fins 204 and 206 being etched during removal of the dummy gate structures 202A and 202B. The fin height, $H_F$, may be increased, after removal of dummy gate structures 202A and 202B, by etching some of the dielectric 208.

Figure 2C:
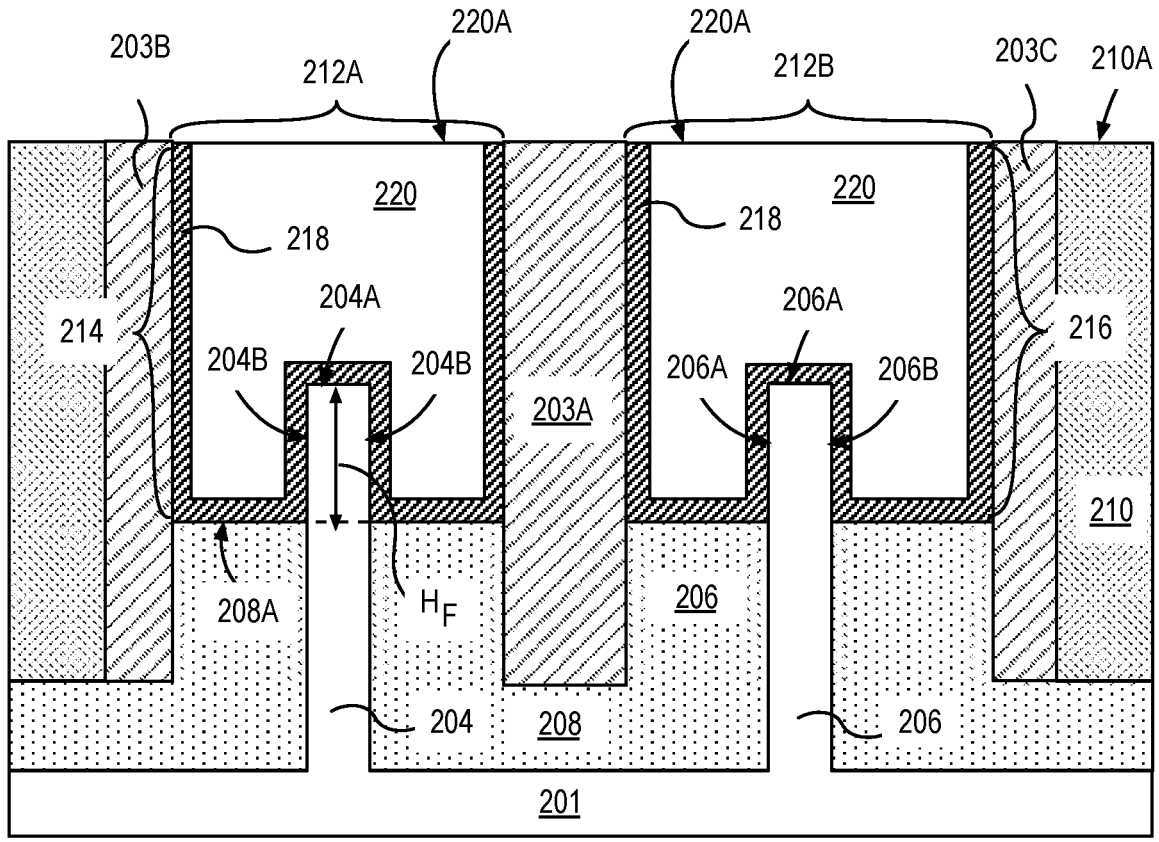
FIG. 2C illustrates the structure of FIG. 2B following the formation of a plurality of transistor gates.

FIG. 2C illustrates the structure of FIG. 2B following the formation of a gate structure 214 in the opening 212A and following the formation of a gate structure 216 in the opening 212B. In the illustrative embodiment, a gate dielectric layer 218 is deposited in the opening 212A, on the fin 204, on uppermost surface 208A, and adjacent to dielectric portions 203A and 203B. As shown gate dielectric layer 218 is also deposited in the opening 212B on the fin 206, on uppermost surface 208A, and adjacent to dielectric portions 203A and 203C.

The gate dielectric layer 218 is also deposited on uppermost surfaces of dielectric portions 203A, 203B and 203C and on uppermost surface 210A. In embodiments, the gate dielectric layer 218 is blanket deposited by an atomic layer deposition (ALD) process. In some embodiments, the gate dielectric layer 218 is deposited to a thickness of up to 2.5 nm. In embodiments, the gate dielectric layer 218 is an insulator having a high dielectric constant (such as a dielectric constant above 4). Examples of high dielectric constant materials that may be used in the gate dielectric layer 218 include hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

In embodiments, the choice of material and thickness of the gate dielectric layer 218 determines a gate capacitance of an FET to be formed.

A gate electrode material may be blanket deposited into the openings 212A and 212B, on gate dielectric layer 218, as well as on the gate dielectric layer (not shown) that is above dielectric portions 203A, 203B and 203C, and on uppermost surface 210A. In an embodiment, a planarization process is utilized to remove portions of the gate dielectric layer 218 and gate electrode material above dielectric portions 203A, 203B and 203C, and uppermost surface 210A. In some exemplary embodiments, a chemical mechanical polish (CMP) process is utilized to form a gate electrode 220 in each of the openings 212A and 212B.

In the illustrative embodiment, the gate electrode 220 is formed on the gate dielectric layer 218 that is on an uppermost surface 204A of fin 204, and adjacent to the gate dielectric layer 218 formed adjacent to sidewall surfaces 204B of the fin 204. As shown, the gate electrode 220 covers a total perimeter P, of the fin 204, that is approximately given by equation [1]:

$$P \sim 2H_F + W_F.$$  [1]

An overlap between the gate electrode 220 and the fin 204 is reduced, along the vertical direction (z-axis), by a thickness of the gate dielectric layer 218. However, in most embodiments the overlap is reduced by less than 10%. The gate electrode 220 that is formed on the gate dielectric layer 218 has features that are substantially identical to the gate electrode 220 formed on the gate dielectric layer 218 in opening 212A.

In embodiments, the CMP process forms gate electrode 220 above each fin 204 and 206 having an uppermost surface 220A is planar or substantially planar. In exemplary embodiments, the gate electrode 220 of each gate structure 214 and 216 is co-planar or substantially co-planar with uppermost surface 210A and uppermost surfaces of dielectric portions 203A, 203B and 203C. The planar uppermost surface 220A of each gate electrode 220 partially influences capacitance of a ferroelectric capacitor to be formed, above the gate electrode 220, in a downstream operation. A non-planar uppermost surface 220A can increase the surface area of a ferroelectric capacitor to be formed.

Depending on whether a P-type or an N-type transistor is desired, gate electrode 220 includes a metal such as ruthenium, palladium, platinum, cobalt, nickel, hafnium, zirconium, titanium, tantalum, aluminum, alloys of these metals, and nitrides or carbides of ruthenium, palladium, platinum, cobalt, nickel, hafnium, zirconium, titanium, tantalum, aluminum such as hafnium nitride, zirconium nitride, titanium nitride, tantalum nitride, and aluminum nitride, or hafnium carbide, zirconium carbide, titanium carbide, tantalum carbide, or aluminum carbide. In some embodiments, the gate electrode 220 includes a work function layer suitable for an NMOS or a PMOS transistor and a fill metal on the work function layer.

Figure 3A:
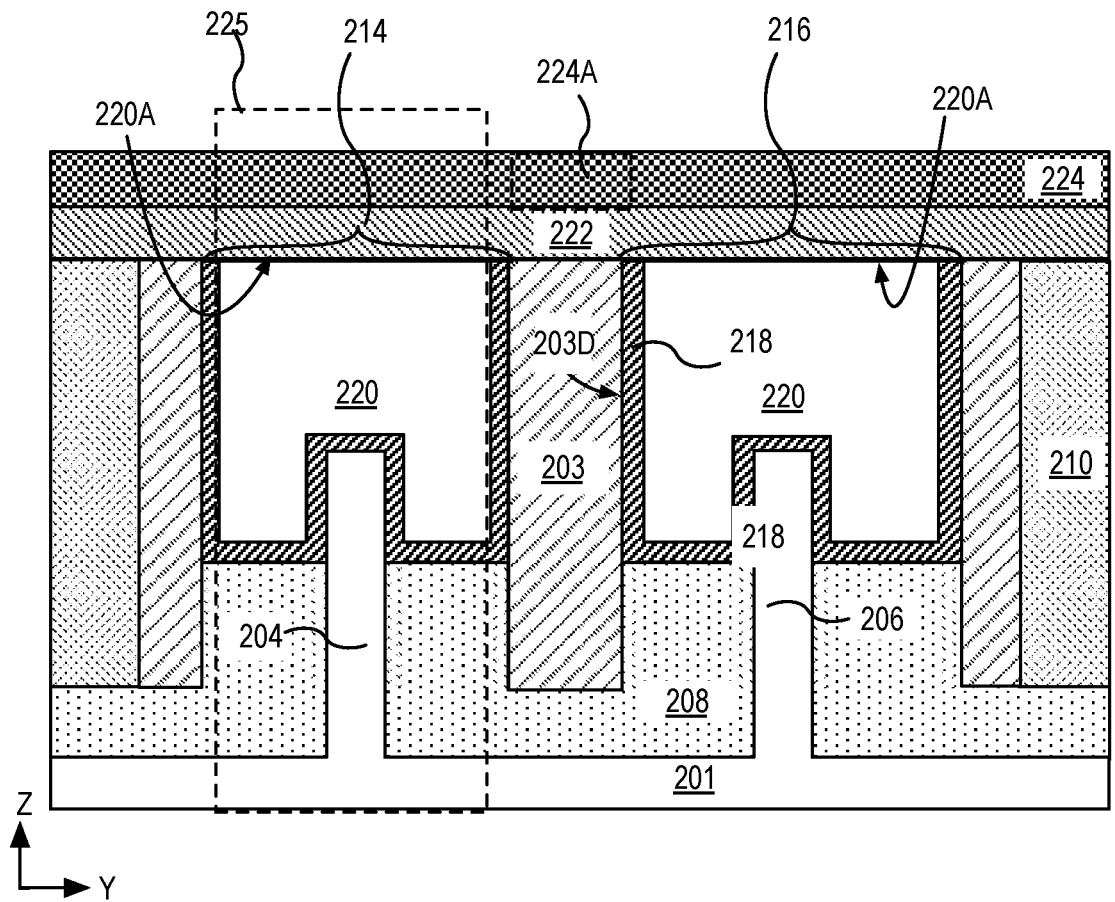
FIG. 3A illustrates the structure of FIG. 2C following the formation of a ferroelectric layer on each of the plurality of transistor gates and following the formation of an electrode on the ferroelectric layer to form a memory device.

FIG. 3A illustrates the structure of FIG. 2C following the formation of a ferroelectric layer 222 and following the formation of a word line 224 on the ferroelectric layer 222. In an embodiment, ferroelectric layer 222 is blanket deposited on the gate electrode 220, gate dielectric layer 218, and on uppermost surfaces of the dielectric 203 and 210. In the illustrative embodiment, the ferroelectric layer 222 is formed on planarized surfaces of the electrodes 220 of each gate structure 214 and 216. As shown, ferroelectric layer 222 also extends between the uppermost surface 220A of each gate structure 214 and 216 and over the dielectric 203 between gate structures 214 and 216. Because of a replacement gate methodology utilized to form gate structures 214 and 216, the ferroelectric layer 222 is in contact with portions of the gate dielectric layer 218 that are not directly adjacent to the fins 204 and 206. In the illustrative embodiment, the ferroelectric layer 222 is contact with portions of the gate dielectric layer 218 adjacent to dielectric sidewall 203D.

In an embodiment, the ferroelectric layer 222 includes a material that has a spontaneous polarization over a temperature range. A single crystal form can advantageously provide ordered domains over a vertical extent (along the x-direction) of the ferroelectric layer 222. At a Curie temperature, $T_C$, the ferroelectric layer 222 can undergo a phase transition between an ordered and disordered states, where the dielectric constant can change by orders of magnitude. In an embodiment, the ferroelectric layer 222 has a thickness between 2 nm and 50 nm.

In an embodiment, the ferroelectric layer 222 includes a material that includes hafnium, zirconium, and oxygen, for e.g., hafnium zirconium oxide (HfZrO, also referred to as HZO, a material that includes hafnium, oxygen, and silicon, for e.g., silicon-doped (Si-doped) hafnium oxide. a material that includes hafnium, oxygen, and germanium, for e.g., germanium-doped (Ge-doped) hafnium oxide, a material that includes hafnium, oxygen, and aluminum, for e.g., aluminum-doped (Al-doped) hafnium oxide, a material that includes hafnium, oxygen, and yttrium, for e.g., yttrium-doped (Y-doped), a material that includes lead, zirconium, and titanium, for e.g., hafnium oxide lead zirconate titanate, a material that includes barium, zirconium and titanium, for e.g., barium zirconate titanate, or any combination of the above. Some embodiments of ferroelectric layer 222 include hafnium, zirconium, barium, titanium, and/or lead, and any combinations of these materials.

In an embodiment, a word line layer is blanket deposited on the ferroelectric layer 222. The word line layer includes a metal or a conductive alloy. For example, the word line layer may include metals such as but not limited to Ti, W, Ta, Ru, Mo, Ir, Pt, Pd or nitrides metals such as Ti, W, Ta or Ru. In an embodiment, the word line layer is patterned to form a word line 224 by forming a mask on the word line layer. In embodiments, the ferroelectric layer 222 is also patterned by the mask. As shown the word line 224 and the ferroelectric layer 222 extends over gate structures 214 and 216 and over dielectric 203 and 210.

In some embodiments, the word line 224 is broken and does not extend continuously above ferroelectric layer 222. In some such embodiments, a portion 224A of the word line 224 is missing from the word line 224.

While only two gate structures 214 and 216 each corresponding to an individual transistor are shown, in exemplary embodiments, ferroelectric layer 222 and word line 224 are continuous over a large number of gate structures, each corresponding to individual transistors. In embodiments, over 100 transistors can be coupled by a single word line 224. In exemplary embodiments, over 1000 transistors are coupled by a single word line 224.

A portion 225 (inside dashed box) defines a single memory device and will be discussed further below.

Figure 3B:
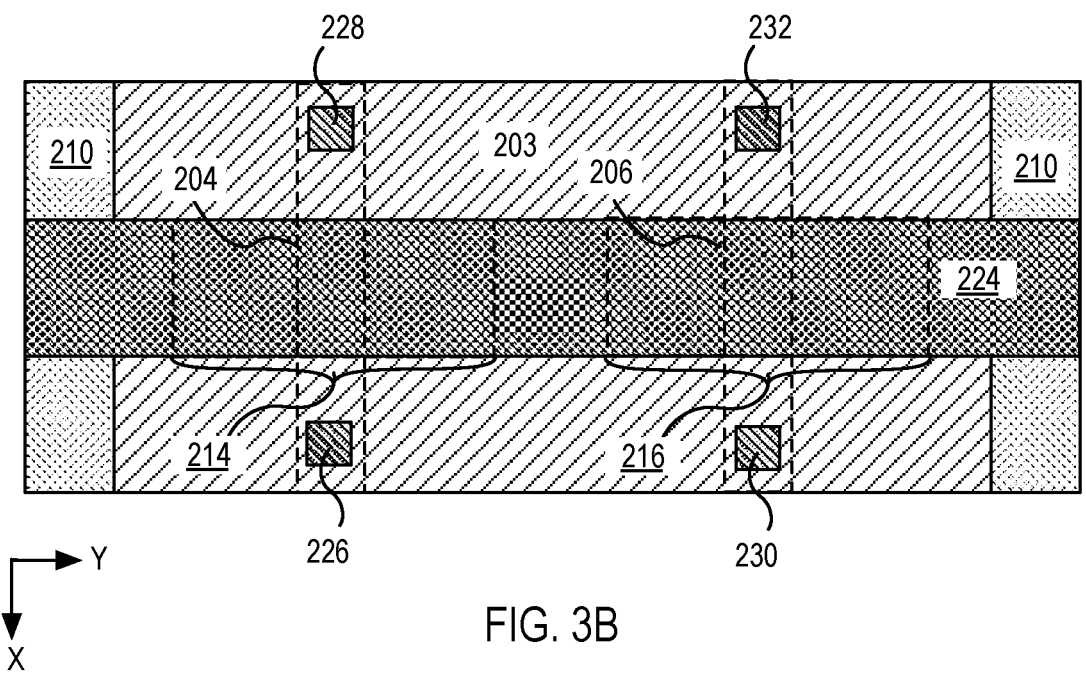
FIG. 3B is a plan-view illustration of the structure of FIG. 2C following the formation of a ferroelectric layer on each of the plurality of transistor gates and following the formation of a source contact on a first region of the fin and a drain contact on a second region of the fin to form a memory device.

FIG. 3B is a plan-view illustration of the structure of FIG. 3A. In an embodiment, the word line 224 extends over gate structures 214 and 216 and over dielectric 203 and 210. In the illustrative embodiment, the word line 224 extends over a portion of the fins 204 and 206 (in dashed lines). The word line 224 is advantageously self-aligned to the gate, as shown. In the illustrative embodiment, a source contact and a drain contact are formed on each fin 204 and 206. For example, a source contact 226 is formed on one end of the fin 204 and a drain contact 228 is formed on a second end of the fin 204. Also as shown, a source structure 230 is formed on one end of the fin 206 and a drain contact 232 is formed on a second end of the fin 206. The source contact 226 and the drain contact 228 are separated by the dielectric 203 and the gate structure 214. Openings may be formed in dielectric 203 above the fins 204 and 206 to form contacts 226 and 228, and contact 230 and 232, respectively. In an exemplary embodiment, the openings may be formed by a plasma etch process. One or more metals may be deposited, in the openings, to form source contacts 226 and 230, and drain contacts 228 and 232. In some examples, a barrier liner including a material such as tantalum nitride or ruthenium may be formed in each of the openings and a fill metal including a metal such as cobalt, ruthenium, copper or tungsten may be deposited on the barrier liner.

Figure 4A:
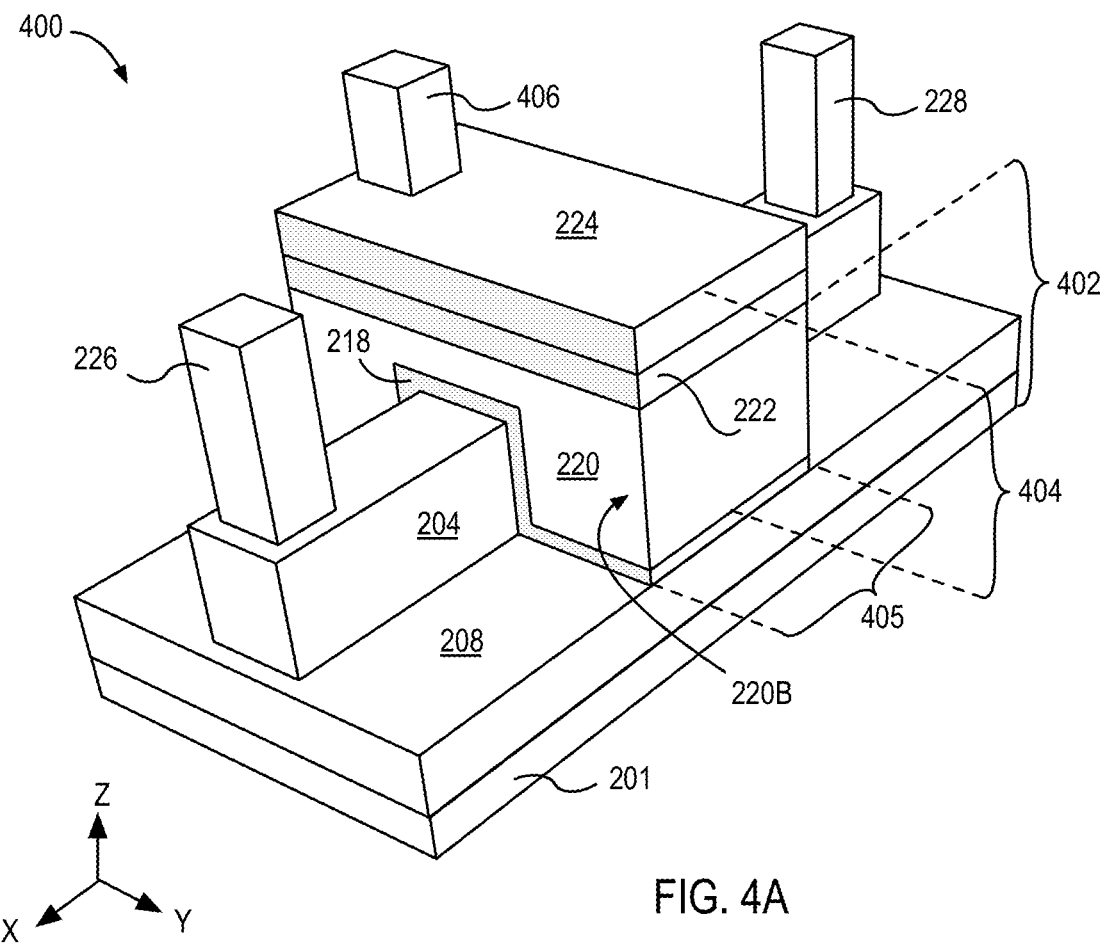
FIG. 4A is an isometric illustration of a portion of the memory device in FIG. 3A.

FIG. 4A is an isometric illustration of a portion (inside dashed lines 225) of the structure in FIG. 3A. The dielectric 203 is omitted for clarity. The structure 400 in FIG. 4A is a memory device 400 that includes a transistor 402 including gate electrode 220 above the fin 204, a source contact 226 on one end of the fin 204 and a drain contact 228 formed on a second end of the fin 204. As shown, transistor 402 is a non-planar transistor. The source contact 226 and drain contact 228 are on opposite ends of the gate electrode 220. In the illustrative embodiment, the source contact 226 and drain contact 228 are formed over a portion of the fin 204. In other embodiments, the source contact 226 and drain contact 228 may wrap around sidewalls of the fin 204. In the illustrative embodiment, the gate electrode 220 wraps around the fin 204, as shown. The gate dielectric layer 218 is between the gate electrode 220 and the fin 204.

The memory device 400 further includes a ferroelectric capacitor 404. The ferroelectric capacitor 404 includes word line 224, ferroelectric layer 222 and the gate electrode 220. As shown, the word line 224 is coupled with a word line contact 406. The gate electrode 220 is not coupled with an external electrode. In exemplary embodiments, the gate electrode 220 is a floating gate electrode.

In the illustrative embodiment, sidewalls of ferroelectric layer 222 and word line 224 are aligned with sidewall 220B of gate electrode 220. In other embodiments, ferroelectric layer 222 and word line 224 may extend laterally along the y-direction for example, beyond the gate electrode sidewall 220B, for practical considerations. In embodiments where ferroelectric layer 222 and word line 224 extend laterally (along the y-direction) beyond the gate electrode sidewalls 220B, electrical characteristics of capacitor are not appreciably altered.

Together the ferroelectric capacitor 404 and the transistor 402 operate in unison as a memory device 400. Operation of memory device 400 will be described further below. Electrical characteristics of memory device 400 depends on relative overlap between various conductive portions within ferroelectric capacitor 404 and transistor 402. More importantly a parameter known as relative capacitance ratio, $C_R$, between a capacitance of the transistor 402 and ferroelectric capacitor 404 influences behavior of the memory device 400. $C_R$ is a ratio of the capacitance of the ferroelectric capacitor 404 and a gate capacitance of transistor 402. An overlap between the word line 224, ferroelectric layer 222 and an uppermost surface of gate electrode 220 defines an area, $A_C$, of the ferroelectric capacitor 404. The material of the ferroelectric layer 222 and capacitor area, $A_C$, define capacitance, $C_{FE}$ of the ferroelectric capacitor 404. An overlap between the gate 220 and the fin 204 partially defines the gate capacitance $C_G$. Dimensions of various features of transistor 402 and ferroelectric capacitor 404, relevant for a capacitance ratio calculation are described with respect to a portion of the memory device 400, defined within dashed lines 405.

Figure 4B:
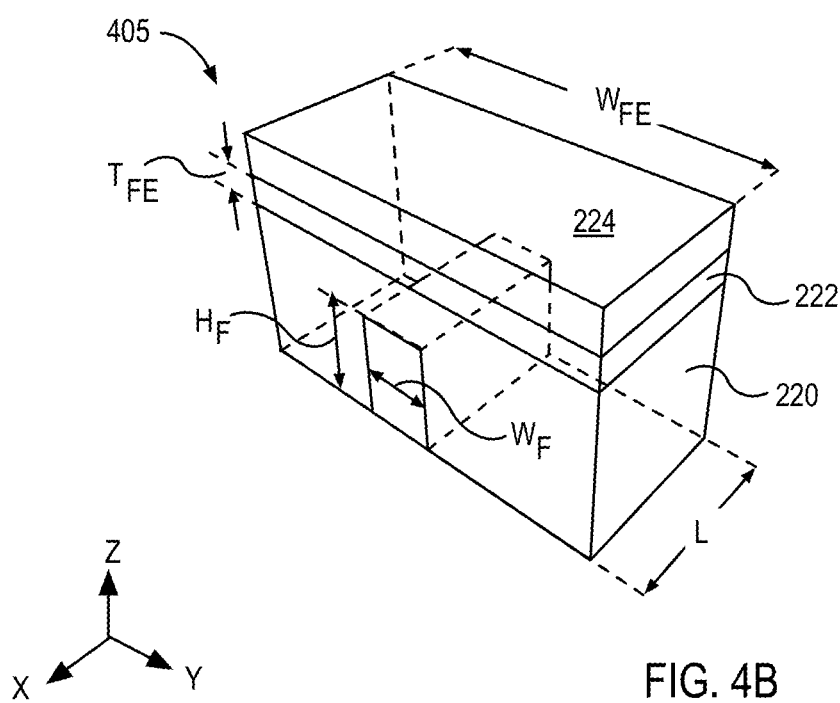
FIG. 4B is an isometric illustration of a gate portion and a capacitor portion of the structure in FIG. 4A.

FIG. 4B is a portion of the memory device 400 defined within dashed lines 405 in the illustration of FIG. 4A. Dimensions of various features of transistor 402 and ferroelectric capacitor 404, relevant for capacitance calculations, are illustrated. The gate dielectric layer and word line contact are removed for clarity. An overlap area, $A_G$, between the gate electrode 220 and the fin 204 is defined by equation [3]:

$$A_G = P*L \qquad [3]$$

Where P is given by equation [2], and $L_G$ is an overlap between fin 204 and gate electrode 220 (as measured along the y-direction).

$C_G$ is approximately defined by equation [4]:

$$C_G \sim \epsilon_{DE} A_G/d = \epsilon_{DE}(P*L_G)/T_{GD} \; C_G \sim \{\epsilon_{DE}(2H_F + W_F)*L_G\}/T_{GD} \quad [4]$$

Where, $\epsilon_{DE}$ and $T_{GD}$ are, respectively, the permittivity and thickness of the gate dielectric layer 218 (not shown).

$C_{FE}$ is defined by equation [5]:

$$C_{FE} = \epsilon_{FE} W_{FE} * L_G / T_{FE} \quad [5]$$

where $W_{FE}$ is a width (along the x-direction) of an uppermost surface 220A of gate electrode 220, $T_{FE}$ is a thickness of the ferroelectric layer 222, $L_G$ is also a length of the ferroelectric capacitor 404, and $\epsilon_{FE}$ is the permittivity of the ferroelectric layer 222.

The capacitance ratio, $C_R$ is given by equation [6]:

$$\begin{aligned} C_R &= C_{FE}/C_G \quad [6] \\ &= [\epsilon_{FE} W_{FE} * L_G / T_{FE}] / [\epsilon_{DE}(2H_F + W_F) * L_G] / T_{DE} \\ &= [\epsilon_{FE} T_{DE}/\epsilon_{DE} T_{FE}][W_{FE}/(2H_F + W_F)] \end{aligned}$$

As shown in equation [6], $C_R$ is independent of $L_G$. In embodiments, a $C_R$ less than 0.5 is advantageous for memory device operation. In exemplary embodiments, the capacitance ratio, $C_R$ may be tuned by controlling physical dimensions of the gate electrode 220 and the fin 204. For example, the capacitance ratio, $C_R$ may be reduced by increasing $H_F$ compared to $W_{FE}$. In some embodiments, $H_F$ is at least 3 times greater than $W_{FE}$. A higher gate capacitance, $C_G$, compared to $C_{FE}$, enables a lower voltage-drop across the transistor and a higher voltage drop across the capacitor, which is desirable for a lower voltage memory operation, as most of the applied voltage will help in the switching of the ferroelectric material.

Referring again to FIG. 4A, while memory device 400 is described with respect to fin 214, memory device 400 is also representative of a memory device structure that includes fin 206 and device structure 216 (that includes gate dielectric layer 218 and gate electrode 220).

Figure 5A:
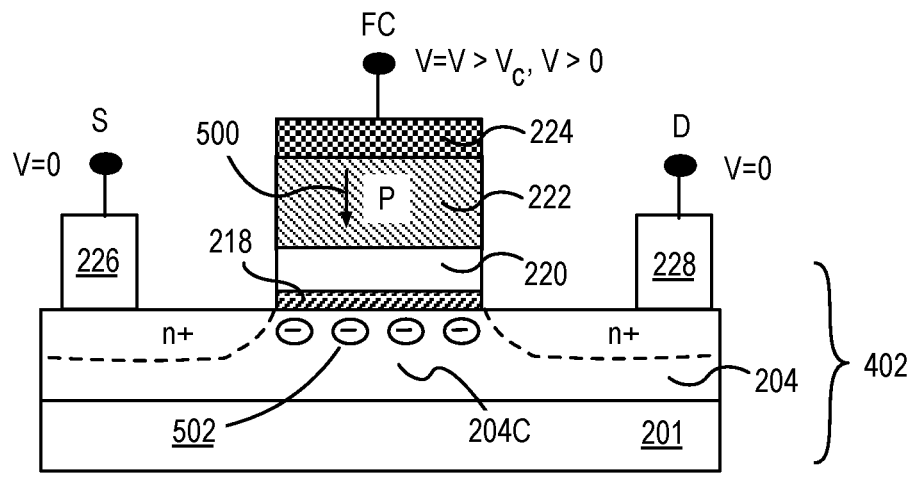
FIG. 5A illustrates a ferroelectric memory device programmed to a first state.
Figure 5B:
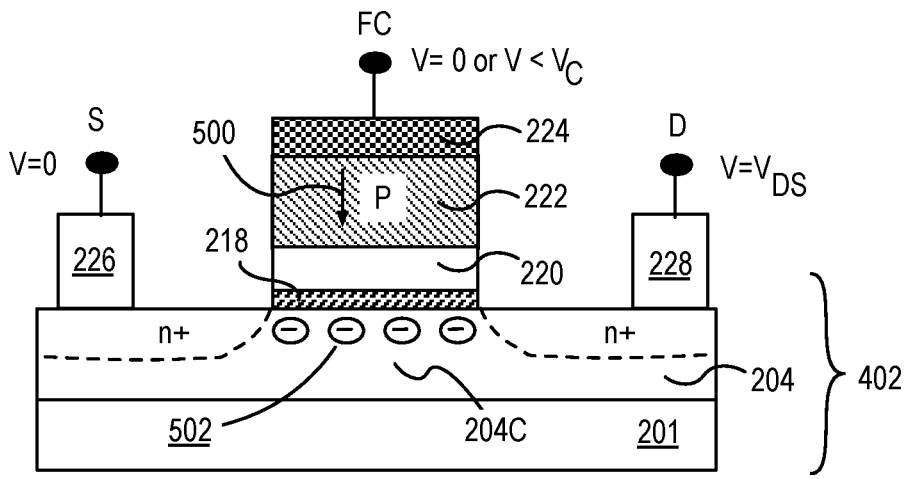
FIG. 5B illustrates an operation to read ferroelectric memory device to determine a state.
Figure 5C:
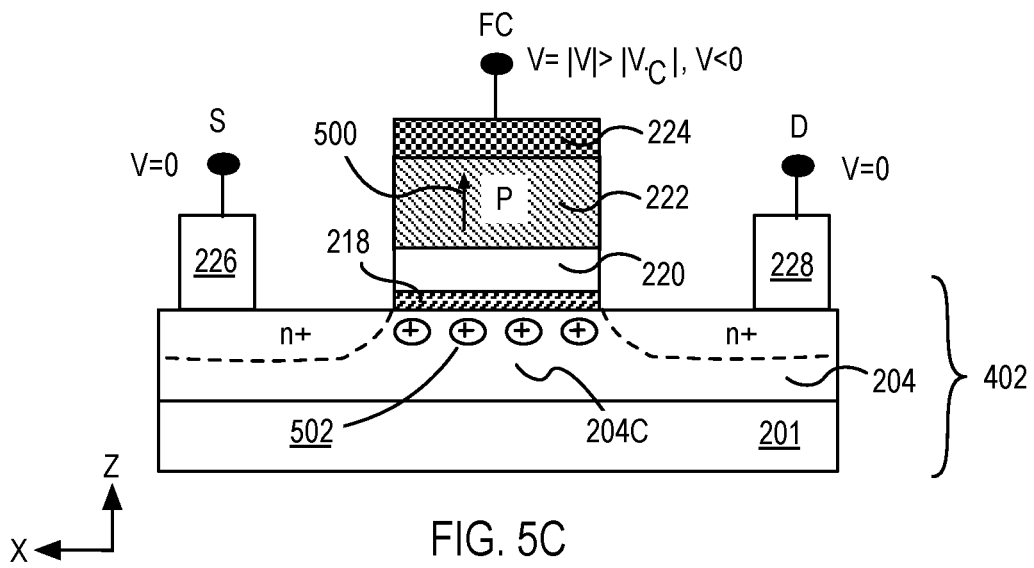
FIG. 5C illustrates a ferroelectric memory device programmed to a second state.

FIGS. 5A-5C illustrate states of the memory device 400 during programming A simplified memory device structure 500 is illustrated in FIG. 5A. Memory device structure 500 includes one or more features of memory device 400, such as fin 204, gate electrode 220, gate dielectric layer 218, ferroelectric layer 222, word line 224, source contact 226 and drain contact 228. In an embodiment, the transistor 402 is an NMOS transistor. In the illustrative embodiment, the source contact 226 and drain contact 228 are each on a first n+ region and a second n+ region, respectively, of the fin 204. The channel region 204D between the first and second n+ regions forms an inversion or a depletion region depending on the bias voltage applied on the terminal FC.

As shown, the terminals S and D, of the source contact 226 and drain contact 228, respectively, are held at ground potential. A positive voltage bias pulse is applied on the terminal FC connected to the word line 224. In an embodiment, the magnitude of the positive voltage bias pulse exceeds the threshold voltage, $V_T$, of the transistor 402 and a coercive voltage $V_C$ of the ferroelectric layer 222. A coercive voltage $V_C$ is a voltage that is required to change a polarization of dipoles in the ferroelectric layer 222. Ferroelectric polarization dipole 500 is set in the ferroelectric layer 222, as shown. In the illustrative embodiment, the ferroelectric polarization dipole 500 is directed towards the channel region 204C of the fin 204. In an embodiment, the floating gate is held at 0V. Applying a positive bias on the terminal A inverts the channel 204C or causes electrons 502 to accumulate in the channel 204C. The polarization dipole 500 set in the ferroelectric layer 222 remains after the voltage pulse is turned off. In some embodiments, if the ferroelectric polarization dipole 500 strength is adequate, the channel 204C remains inverted. In other embodiments, net negative charges accumulate in channel 204C but may not be enough to fully invert the channel.

FIG. 5B illustrates a read operation. In an embodiment, terminal FC is held at ground. There is no action in then channel 204C. A voltage bias $V_{DS}$ (where $V_{DS} > 0$) is applied to the drain terminal, D relative to the source terminal C and the current is measured. Unlike a MOS transistor, in embodiments, where the channel is already inverted, an application of $V_{DS}$, causes a current to flow through the channel 204C. For an NMOS device, application of a bias $V_{DS} > 0$, causes current to flow. Registering a current under such conditions implies a state of the ferroelectric polarization dipole. In some embodiments, where the channel includes negative charges, a small voltage bias $V < V_C$ may be applied to the FC, to cause inversion in the channel 204C, during the read operation.

FIG. 5C illustrates a reset operation or an operation where the state of the ferroelectric polarization dipole is reversed. In an embodiment, a voltage pulse $|V| > |V_C|$ but of negative polarity is applied to terminal FC. This causes the ferroelectric polarization dipole 500 to reverse direction. As shown, the ferroelectric polarization dipole 500 is directed towards the ferroelectric layer 222. A negative voltage bias on terminal FC, induces holes in the channels or causes accumulation in the channel 204C.

A read operation may be performed by applying a small voltage bias $V_{DS}$, where $V_{DS} > 0$. A small current below a defined threshold current, can specify that state of the ferroelectric polarization dipole 500.

Referring again to FIG. 3A, during operation, only portions of the ferroelectric layer 222 directly adjacent the gate electrode 220 of gate structure 214 or gate structure 216 are polarized. Portions of the ferroelectric layer 222 above dielectric 203 and 210 are not affected by voltage biasing of the word line 224 relative to the gate electrode 220. In embodiments where two or more devices on a same word line are to be programmed to different polarization states, an inhibit voltage may be programmed between source structure 230 and drain structure 232 (shown in FIG. 3B). Thus, two or more independent memory devices can be formed and operated.

Figure 6:
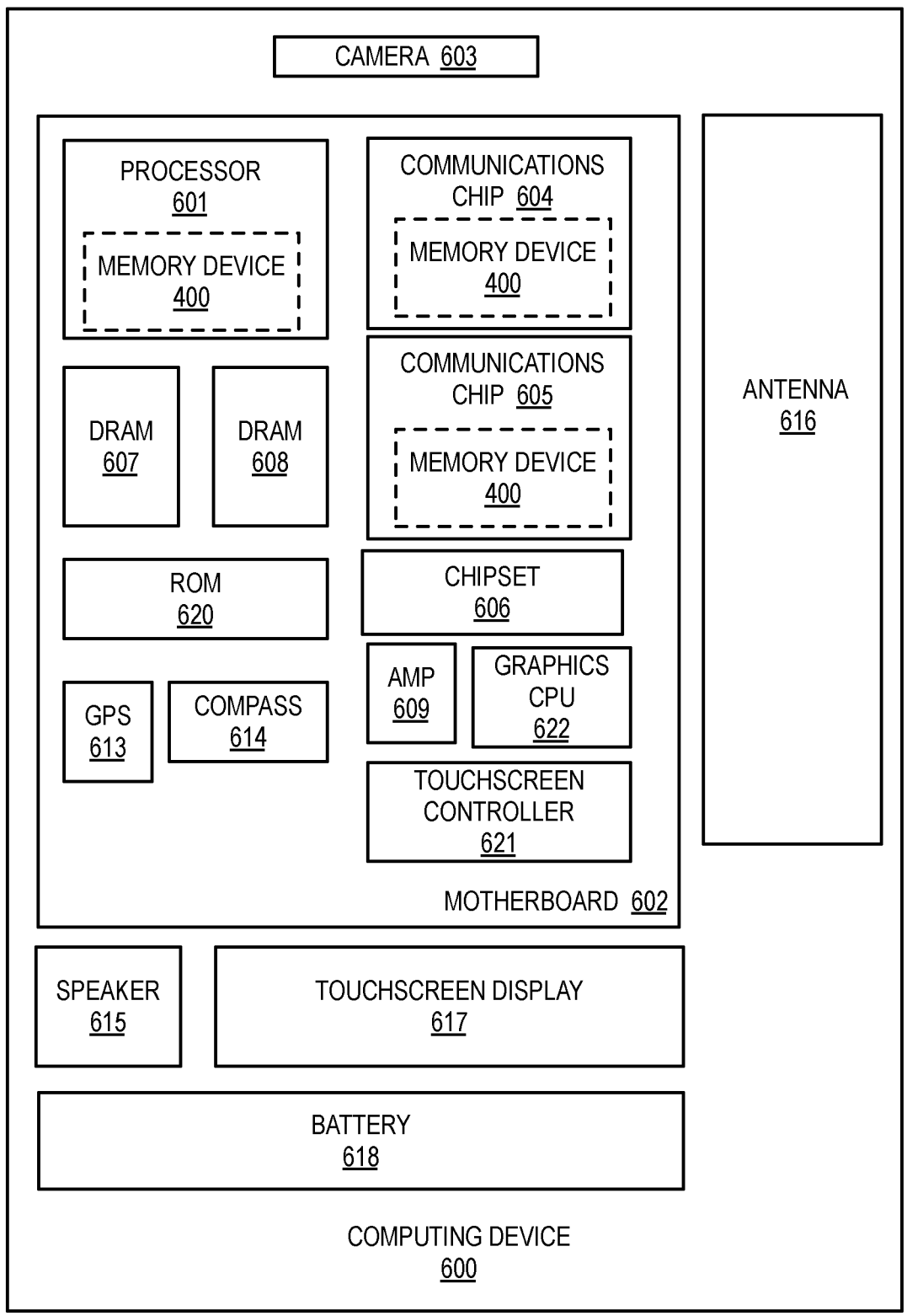
FIG. 6 illustrates a computing device in accordance with embodiments of the present disclosure.

FIG. 6 illustrates a computing device 600 in accordance with embodiments of the present disclosure. As shown, computing device 600 houses a motherboard 602. Motherboard 602 may include a number of components, including but not limited to a processor 601 and at least one communications chip 604 or 605. Processor 601 is physically and electrically coupled to the motherboard 602. In some implementations, communications chip 605 is also physically and electrically coupled to motherboard 602. In further implementations, communications chip 605 is part of processor 601.

Depending on its applications, computing device 600 may include other components that may or may not be physically and electrically coupled to motherboard 602. These other components include, but are not limited to, volatile memory (e.g., DRAM), non-volatile memory (e.g., ROM), flash memory, a graphics processor, a digital signal processor, a crypto processor, a chipset 606, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 605 enables wireless communications for the transfer of data to and from computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 605 may implement any of a number of wireless standards or protocols, including but not limited to Wi-Fi (IEEE 801.11 family), WiMAX (IEEE 801.11 family), long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 600 may include a plurality of communications chips 604 and 605. For instance, a first communications chip 605 may be dedicated to shorter range wireless communications such as Wi-Fi and Bluetooth and a second communications chip 604 may be dedicated to longer range wireless communications such as GPS, EDGE, GPRS, CDMA, WiMAX, LTE, Ev-DO, and others.

Processor 601 of the computing device 600 includes an integrated circuit die packaged within processor 601. In some embodiments, the integrated circuit die of processor 601 includes one or more interconnect structures, non-volatile memory devices, and transistors, capacitors, and coupled ferroelectric capacitors and transistors such as memory device 400. The term "processor" may refer to any device or portion of a device that processes electronic data from registers and/or memory to transform that electronic data into other electronic data that may be stored in registers and/or memory.

Communications chip 605 also includes an integrated circuit die packaged within communication chip 605. In another embodiment, the integrated circuit die of communications chips 604, 605 includes one or more interconnect structures, non-volatile memory devices, transistors, capacitors, and coupled capacitors and transistors such as memory device 400. Depending on its applications, computing device 600 may include other components that may or may not be physically and electrically coupled to motherboard 602. These other components may include, but are not limited to, volatile memory (e.g., DRAM) 607, 608, non-volatile memory (e.g., ROM) 620, a graphics CPU 622, flash memory, global positioning system (GPS) device 613, compass 614, a chipset 606, an antenna 616, a power amplifier (AMP) 609, a touchscreen controller 621, a touchscreen display 617, a speaker 615, a camera 603, and a battery 618, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 600 and discussed above may contain a stand-alone integrated circuit memory die that includes one or more arrays of NVM devices.

In various implementations, the computing device 600 may be a laptop, a netbook, a notebook, an Ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
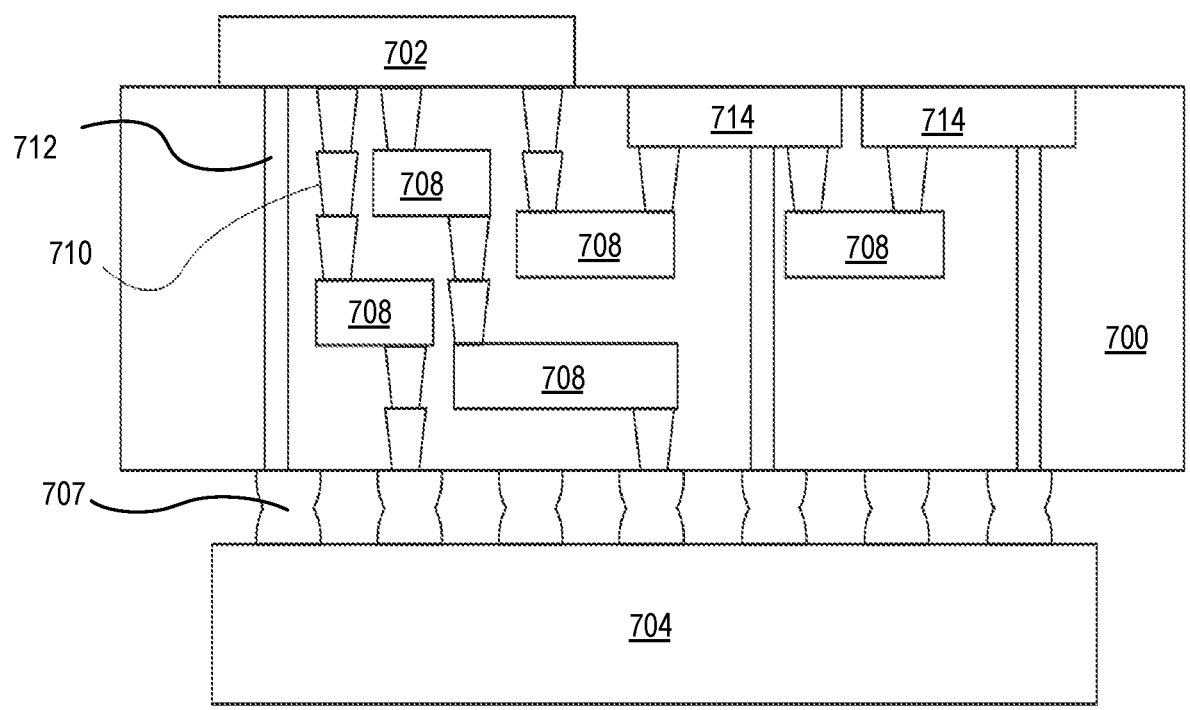
FIG. 7 illustrates an integrated circuit (IC) structure that includes one or more embodiments of the disclosure.

FIG. 7 illustrates an integrated circuit (IC) structure 700 that includes one or more embodiments of the disclosure. The integrated circuit (IC) structure 700 is an intervening substrate used to bridge a first substrate 702 to a second substrate 704. The first substrate 702 may be, for instance, an integrated circuit die. The second substrate 704 may be, for instance, a memory module, a computer mother, or another integrated circuit die. Generally, the purpose of an integrated circuit (IC) structure 700 is to spread a connection to a wider pitch or to reroute a connection to a different connection. For example, an integrated circuit (IC) structure 700 may couple an integrated circuit die to a ball grid array (BGA) 707 that can subsequently be coupled to the second substrate 704. In some embodiments, the first substrate 702 and the second substrate 704 are attached to opposing sides of the integrated circuit (IC) structure 700. In other embodiments, the first substrate 702 and the second substrate 704 are attached to the same side of the integrated circuit (IC) structure 700. And in further embodiments, three or more substrates are interconnected by way of the integrated circuit (IC) structure 700.

The integrated circuit (IC) structure 700 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials.

The integrated circuit (IC) structure may include metal interconnects 708 and vias 710, including but not limited to through-silicon vias (TSV) 712. The integrated circuit (IC) structure 700 may further include embedded devices 714, including both passive and active devices. Such embedded devices 714 include capacitors, decoupling capacitors, resistors, inductors, fuses, diodes, transformers, device structure including transistors, and coupled ferroelectric capacitors and transistors such as memory device 400, such as memory device described in association with FIG. 4A. Referring again to FIG. 7, the integrated circuit (IC) structure 700 may further include embedded devices 714 such as one or more resistive random-access devices, sensors, and electrostatic discharge (ESD) devices. More complex devices such as radiofrequency (RF) devices, power amplifiers, power management devices, antennas, arrays, sensors, and MEMS devices may also be formed on the integrated circuit (IC) structure 700.

In a first example, a memory device includes a transistor structure including a gate electrode over a top surface of a fin and adjacent to a sidewall of the fin, a source structure coupled to a first region of the fin and a drain structure coupled to a second region of the fin, where the gate electrode is between the first region and the second region and a gate dielectric layer between the fin and the gate electrode. The memory device capacitor coupled with the transistor structure, the capacitor includes the gate electrode, a ferroelectric layer on a substantially planar uppermost surface of the gate electrode and a word line on the ferroelectric layer.

In second examples, for any of first example, the sidewall is a first sidewall, and the gate electrode is adjacent to a second sidewall of the fin, where the second sidewall is opposite to the first sidewall.

In third examples, for any of the first through second examples, the fin includes a first lateral thickness defined by a distance between the first sidewall and the second sidewall, and where the fin includes a vertical thickness defined by a distance from an uppermost surface of a dielectric adjacent to the first sidewall to the top surface of the fin, where the vertical thickness is at least 3 times the first lateral thickness.

In fourth examples, for any of the first through third examples, the planar uppermost surface of the gate electrode includes a second lateral thickness measured along a direction from the first sidewall to the second sidewall, where the second lateral thickness is less than a combined sum of the first lateral thickness and two times the vertical thickness.

In fifth examples, for any of the first through fourth examples, the second lateral thickness is less than the vertical thickness.

In sixth examples, for any of the first through fifth examples, the ferroelectric layer and the word line each include a third lateral thickness measured along the direction from the first sidewall to the second sidewall, where the second lateral thickness is substantially equal the third lateral thickness.

In seventh examples, for any of the first through sixth examples, wherein the ferroelectric layer includes oxygen and one or more of lead, hafnium, zirconium, aluminum, titanium, yttrium, strontium, or titanium, or oxygen and two or more of lead, silicon, hafnium, zirconium, aluminum, titanium, yttrium, strontium, or titanium.

In eighth examples, for any of the first through seventh examples, the ferroelectric layer has a thickness between 2 nm and 50 nm.

In ninth examples, for any of the first through eighth examples, where the gate dielectric layer has a thickness between 1 nm and 2 nm and wherein the gate dielectric layer includes a material that is different from a material of the ferroelectric layer.

In tenth examples, for any of the first through ninth examples, the ferroelectric layer is in contact with a portion of the gate dielectric layer not adjacent to the fin.

In eleventh examples, a memory device, includes a plurality of transistors, where individual ones of the plurality of transistors are laterally separated by a dielectric. The individual ones of the plurality of transistors include a gate electrode over a top surface of a fin and adjacent to a sidewall of the fin, a source structure coupled to a first region of the fin and a drain structure coupled to a second region of the fin, where the gate electrode is between the first and the second region and a gate dielectric layer is between the fin and the gate electrode. The memory device further includes a plurality of capacitors, where individual ones of the plurality of capacitors are coupled with individual ones of the plurality of transistors. The individual ones of the plurality of capacitors include the gate electrode, a ferroelectric layer on a substantially planar uppermost surface of the gate electrodes of the individual ones of the plurality of transistors and where the ferroelectric layer extends continuously between the uppermost surface of the gate electrodes of the individual ones of the plurality of transistors and over the dielectric. The memory device further includes a word line on the ferroelectric layer.

In twelfth examples, for any of the eleventh examples, where the sidewall is a first sidewall, and the gate electrode is adjacent to a second sidewall of the fin, where the second sidewall is opposite to the first sidewall.

In thirteenth examples, for any of the eleventh through twelfth examples, the fin includes a first lateral thickness defined by a distance between the first sidewall and the second sidewall, and where the fin includes a vertical thickness defined by a distance from an uppermost surface of a dielectric adjacent to the first sidewall to the top surface of the fin, where the vertical thickness is at least 3 times the first lateral thickness.

In a fourteenth example, for any of the eleventh through thirteenth examples, the planar uppermost surface of the gate electrode includes a second lateral thickness measured along a direction from the first sidewall to the second sidewall, where the second lateral thickness is less than a combined sum of the first lateral thickness and two times the vertical thickness.

In fifteenth examples, for any of the eleventh through fourteenth examples, the ferroelectric layer and the word line each include a third lateral thickness measured along the direction from the first sidewall to the second sidewall, wherein the third lateral thickness is at least equal to two times the second lateral thickness.

In sixteenth examples, for any of the fifteenth examples, the second lateral thickness is less than the vertical thickness.

In seventeenth examples, a method to fabricate a memory device includes receiving a work piece including a non-planar dummy gate structure adjacent a fin, removing the dummy gate structure and forming a gate structure on a top surface and on sidewalls of the fin and planarizing the gate structure to form a planar top surface. The method further includes forming a ferroelectric layer on the planar top surface of the gate structure and forming a word line on the ferroelectric layer.

In eighteenth examples, for any of seventeenth examples, forming the gate structure includes forming a gate dielectric layer on a top surface and on sidewalls of the fin and forming a gate electrode on the gate dielectric layer above the top surface of the fin and overlapping the gate electrode with sidewalls of the fin.

In nineteenth examples, for any of the seventeenth through eighteenth examples, the method further includes patterning the electrode and the ferroelectric layer.

In twentieth example, for any of the seventeenth through nineteenth examples, the method further includes forming a source contact on a first region of the fin and forming a drain contact on a second region of the fin.

What is claimed is:
1. A memory device, comprising:
 a plurality of transistor structures, wherein individual ones of the plurality of transistors are laterally separated by an intervening dielectric, and wherein individual ones of the plurality of transistors comprise:
  a gate electrode over a top surface of a fin and adjacent to a sidewall of an upper portion of the fin, the upper portion of the fin having a vertical thickness over an underlying dielectric adjacent to a sidewall of a lower portion of the fin;
  a source structure coupled to a first region of the fin and a drain structure coupled to a second region of the fin, wherein the gate electrode is between the first and the second region; and a gate dielectric layer between the sidewall of the upper portion of the fin and the gate electrode, and between the gate electrode and a sidewall of the intervening dielectric; and a plurality of capacitors, wherein individual ones of the plurality of capacitors are coupled with individual ones of the plurality of transistors, the individual ones of the plurality of capacitors, comprising:

the gate electrode;

a ferroelectric layer on a substantially planar uppermost surface of the gate electrodes of the individual ones of the plurality of transistors and wherein the ferroelectric layer extends continuously between the uppermost surface of the gate electrodes of the individual ones of the plurality of transistors and over the intervening dielectric; and a word line on the ferroelectric layer, wherein the word line extends continuously between the uppermost surface of the gate electrodes of the individual ones of the plurality of transistors and over the intervening dielectric.

2. The memory device of claim 1, wherein the sidewall of the upper portion of the fin is a first sidewall of the upper portion of the fin, and the gate electrode is adjacent to a second sidewall of the upper portion of the fin, wherein the second sidewall is opposite to the first sidewall of the upper portion of the fin.

3. The memory device of claim 2, wherein the fin comprises a first lateral thickness defined by a distance between the first sidewall of the upper portion of the fin and the second sidewall of the upper portion of the fin, and wherein the vertical thickness is at least 5 times the first lateral thickness.

4. The memory device of claim 3, wherein the planar uppermost surface of the gate electrode comprises a second lateral thickness measured along a direction from the first sidewall of the upper portion of the fin to the second sidewall of the upper portion of the fin, and wherein the second lateral thickness is less than a combined sum of the first lateral thickness and two times the vertical thickness.

5. The memory device of claim 4, wherein the ferroelectric layer and the word line each comprise a third lateral thickness measured along the direction from the first sidewall of the upper portion of the fin to the second sidewall of the upper portion of the fin, and wherein the third lateral thickness is greater than two times the second lateral thickness.

6. The memory device of claim 4, wherein the second lateral thickness is less than the vertical thickness.

7. The memory device of claim 2, wherein the fin comprises a first lateral thickness defined by a distance between the first sidewall of the upper portion of the fin and the second sidewall of the upper portion of the fin, and wherein the vertical thickness is at least 3 times the first lateral thickness.

8. The memory device of claim 7, wherein the planar uppermost surface of the gate electrode comprises a second lateral thickness measured along a direction from the first sidewall to the second sidewall, wherein the second lateral thickness is less than a combined sum of the first lateral thickness and two times the vertical thickness.

9. The memory device of claim 8, wherein the second lateral thickness is less than the vertical thickness.

10. The memory device of claim 1, wherein the ferroelectric layer comprises oxygen and one or more of lead, hafnium, zirconium, aluminum, titanium, yttrium, strontium, or titanium, or oxygen and two or more of lead, silicon, hafnium, zirconium, aluminum, titanium, yttrium, strontium, or titanium.

11. The memory device of claim 1, wherein the ferroelectric layer comprises a thickness between 2 nm and 50 nm.

12. The memory device of claim 1, wherein the gate dielectric layer comprises a thickness between 1 nm and 2 nm, and wherein the gate dielectric layer comprises a material that is different from a material of the ferroelectric layer.

13. The memory device of claim 1, wherein the ferroelectric layer is in contact with a portion of the gate dielectric layer not adjacent to the fin.

* * * * *